United States Patent
Culp et al.

(10) Patent No.: US 8,302,068 B2
(45) Date of Patent: Oct. 30, 2012

(54) LEAKAGE AWARE DESIGN POST-PROCESSING

(75) Inventors: James A. Culp, Newburgh, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 12/689,481

(22) Filed: Jan. 19, 2010

(65) Prior Publication Data

US 2011/0179391 A1 Jul. 21, 2011

(51) Int. Cl.
  G06F 15/04 (2006.01)
  G06F 17/50 (2006.01)
(52) U.S. Cl. ............... 716/139; 716/51; 716/53; 716/56
(58) Field of Classification Search .................... 716/139
  See application file for complete search history.

(56) References Cited

U.S. PATENT DOCUMENTS

| 2006/0070018 A1* | 3/2006 | Semmler ..................... 716/21 |
| 2006/0101355 A1* | 5/2006 | Ciplickas et al. .................. 716/2 |
| 2007/0106968 A1 | 5/2007 | Culp et al. |
| 2008/0147374 A1* | 6/2008 | Chan et al. ..................... 703/14 |
| 2008/0263483 A1* | 10/2008 | Koike et al. ..................... 716/5 |
| 2008/0270956 A1* | 10/2008 | Murakami ..................... 716/5 |

OTHER PUBLICATIONS

Banerjee et al., "Electrically Driven Optical Proximity Correction", Design for Manufacturability through Design-Process Integration II, Proc. of SPIE, vol. 6925, pp. 69251W-1-69251W-9 (2008).

* cited by examiner

*Primary Examiner* — Paul Dinh
*Assistant Examiner* — Bryce Aisaka
(74) *Attorney, Agent, or Firm* — Yuanmin Cai; Todd Li

(57) ABSTRACT

The present invention provides a method and computer program product for designing an on-wafer target for use by a model-based design tool such as OPC or OPC verification. The on-wafer target is modified by modifying a critical dimension so as to improve or optimize an electrical characteristic, while also ensuring that one or more yield constraints are satisfied. The use of an electrically optimized target can result in cost-effective mask designs that better meet the designers' intent.

18 Claims, 9 Drawing Sheets

LEAKAGE AWARE DESIGN POST-PROCESSING

FIELD OF THE INVENTION

The present invention broadly relates to the design of integrated circuits, particularly to the design of lithographic masks, and more particularly to improvements in creating targets for use in model-based optical proximity correction (MBOPC) or OPC Verification tools used in mask design processes.

BACKGROUND

In the manufacture of integrated circuits, photolithographic processes are commonly used, in which a wafer is patterned by projecting radiation through a patterned mask to form an image pattern on a photo sensitive material, referred to as a photoresist, or simply resist. The exposed resist material is developed to form openings corresponding to the image pattern, and then the pattern is transferred to the wafer substrate by methods such as etching, as known in the art.

The basic lithography system consists of a light source, a photomask containing the pattern to be transferred to the wafer, a collection of lenses, and a means for aligning existing patterns on the wafer with patterns on the mask. The mask design process as described herein covers the steps from chip design, model-based optical proximity correction (OPC), OPC Verification and mask fabrication. Such mask design processes typically rely on accurate numerical models of the imaging processes, which are herein referred to as lithographic models, which provide predictions of the images produced by various lithographic processes, such as optical imaging and resist processes, as well as images resulting from other processes such as resist, etch and chemical-mechanical polish (CMP) process images.

A lithography stepper is limited by parameters described in Rayleigh's equation:

$$R = k_1 \frac{\lambda}{NA} \quad \text{Eq. 1}$$

where $\lambda$ is the wavelength of the light source used in the projection system and NA is the numerical aperture of the projection optics used. The highest resolution in optical lithography is currently achieved with deep ultra violet (DUV) steppers operating at 193 nm wavelength. Steppers operating at wavelengths of 248 and 365 nm are also in widespread use. $k_1$ is a factor describing how well a combined lithography system can utilize the theoretical resolution limit in practice and can range from 0.8 down to <0.5 for standard exposure systems.

OPC tools attempt to optimize the photomask design to compensate for optical effects on the pattern transfer process that originate from the lithographic process, which includes the steps of resist, exposure and etch. Such optical effects include pitch-dependent linewidth variations, flare, corner rounding and line-end shortening. An OPC tool optimizes a mask design by modifying mask features from the original designed polygons, typically by moving edge fragments, to ensure that layout features print according to specifications. The model-based OPC (MBOPC) flow typically consists of contour generation simulated by a lithographic process model, followed by optimization to reduce geometric error between the resist contour and a target feature. However, under low-$k_1$ lithography processes typically in use, the printing of perfect polygons is practically impossible to achieve. This in turn leads to errors in electrical properties of the printed patterns relative to the desired design.

To address the errors in electrical properties, electrically-driven optical proximity correction (ED-OPC) has been proposed. ED-OPC uses electrical matching directly as an objective of OPC. An ED-OPC tool combines lithography simulation with accurate electrical modeling of resist contours to predict the on/off current through a transistor gate. The computation of mask edge movements is cast as a linear program based on both optical and electrical sensitivities. The objective is to minimize the error in saturation current between printed and target shapes. This approach has resulted in improved timing accuracy as compared to conventional geometrically-based OPC optimization. Banerjee et al. ("Compensating Non-Optical Effects using Electrically-Driven Optical Proximity Correction," Proc. of SPIE, Vol. 6925, pp. 69251W-1-69251W-9 (2008)) disclosed the use of ED-OPC to compensate for other sources of process variation, such as well implant proximity effect, rapid thermal annealing (RTA) variations and stress variations. However, ED-OPC is more time consuming and costly than conventional OPC.

Another approach to address electrical errors has been disclosed by Culp et al. (US 2007/0106968). Culp et al. disclose identifying timing sensitive devices that are within a critical timing path of an integrated circuit, generating an additional mask by a selective trim to shorten the gate lengths of the timing sensitive devices, without shortening gate lengths of devices that are not within the critical timing path, and generating new timing rules for the trimmed devices and comparing the new timing rules to product requirements, and repeating the steps for the identified timing sensitive devices until product requirements are met. However, the method disclosed by Culp et al. is implemented during the design phase and is not easily modified to account for process variations which may not be known during the design phase.

In view of the above, there is a need for a method to provide a mask optimization methodology that can more rapidly and effectively account for process variability while meeting electrical product requirements.

SUMMARY OF THE INVENTION

The present invention provides a method, computer program product and computer system for designing a lithographic mask in which the on-wafer target shape is modified to optimize or improve an electrical characteristic, within a predetermined electrical criterion, subject to one or more electrical or geometric constraints. The resulting modified target may be provided to a mask design tool, such as MBOPC or OPC verification. The use of the modified target provides a cost effective method for better meeting the designers' intent.

According to one aspect of the invention, a method is provided for method of designing a lithographic mask including the steps of providing an integrated circuit design comprising a device layer of shapes to be printed and an initial on-wafer target layout corresponding to the device layer; providing an electrical metric for the integrated circuit design, the electrical metric having a functional relationship to a first dimension that is represented in the initial on-wafer target layout; providing a yield metric having a functional relationship to the first dimension that is represented in the initial on-wafer target layout; and improving the electrical metric, within a predetermined electrical criterion, in the initial on-wafer target layout by modifying the first dimension to form a modified target layout such that a computed yield metric based on the modified target layout satisfies a predetermined yield constraint. In a preferred embodiment, the electrical metric to be optimized is leakage current.

According to another aspect of the invention, the step of improving the electrical metric includes modifying the first dimension by a predetermined increment to form the modified target layout; computing the yield metric based on said modified target layout; comparing the computed yield metric with the predetermined yield constraint; and repeating the steps of modifying the first dimension, computing the yield metric based on the modified target layout and comparing the computed yield metric, as long as the computed yield metric satisfies the predetermined yield constraint.

The electrical metric and yield metric may be selected based on the sensitivity of a device characteristic to a change in dimension of the target shape. The dimensions of the target shape may be modified asymmetrically.

The method according to the invention may be implemented in a computer program product comprising a computer storage medium including computer readable instructions wherein the computer readable instructions when executed on a computer system causes the computer system to perform the method steps of providing an integrated circuit design comprising a device layer of shapes to be printed and an initial on-wafer target layout corresponding to the device layer; providing an electrical metric for the integrated circuit design, the electrical metric having a functional relationship to a first dimension that is represented in the initial on-wafer target layout; providing a yield metric having a functional relationship to the first dimension that is represented in the initial on-wafer target layout; and improving the electrical metric, within a predetermined electrical criterion, in said initial on-wafer target layout by modifying the first dimension to form a modified target layout such that a computed yield metric based on the modified target layout satisfies a predetermined yield constraint.

The foregoing and other features and advantages of the invention will be apparent from the following detailed description of the invention.

BRIEF DESCRIPTION OF THE DRAWINGS

Referring to the exemplary drawings wherein like elements are numbered alike in the several figures, not necessarily drawn to scale, in which.

DETAILED DESCRIPTION OF THE INVENTION

This invention presents a method for designing and optimizing a lithographic mask that accounts for lithographic process variations across the layout while meeting designers' intent for product requirements. The term "lithographic process" as used and referred to herein, includes, without limitation, any pattern transfer process, such as forming a resist image, forming implants, performing a patterned etch, etc. An integrated circuit design or chip design typically includes layouts of multiple layers of shapes to be printed. A device layer may be printed by using one or more lithographic masks. The on-wafer target is used by an OPC tool or OPC verification tool during the mask design process by ensuring or verifying that simulated image contours resulting from the mask (or masks) for printing a given layer matches the on-wafer target according to predetermined criteria. More particularly, the method, in accordance with the invention, modifies the initial design target by optimizing the on-wafer target used for optimizing a mask design in an OPC or OPC verification tool. The on-wafer target is modified to optimize an improvement in a device electrical metric, such as minimizing leakage current or power, subject to appropriate lithographic process, electrical or other yield constraints. The resulting optimized target is provided to a standard geometric-based MBOPC or OPC verification tool, and the resulting optimized mask will result in images that better meet the designers' intent than a standard OPC-optimized mask that is based on the original geometrically-designed target. A target optimized in accordance with the invention may also be provided to an ED-OPC tool, to increase the turn-around time of ED-OPC optimization.

Figure 1:
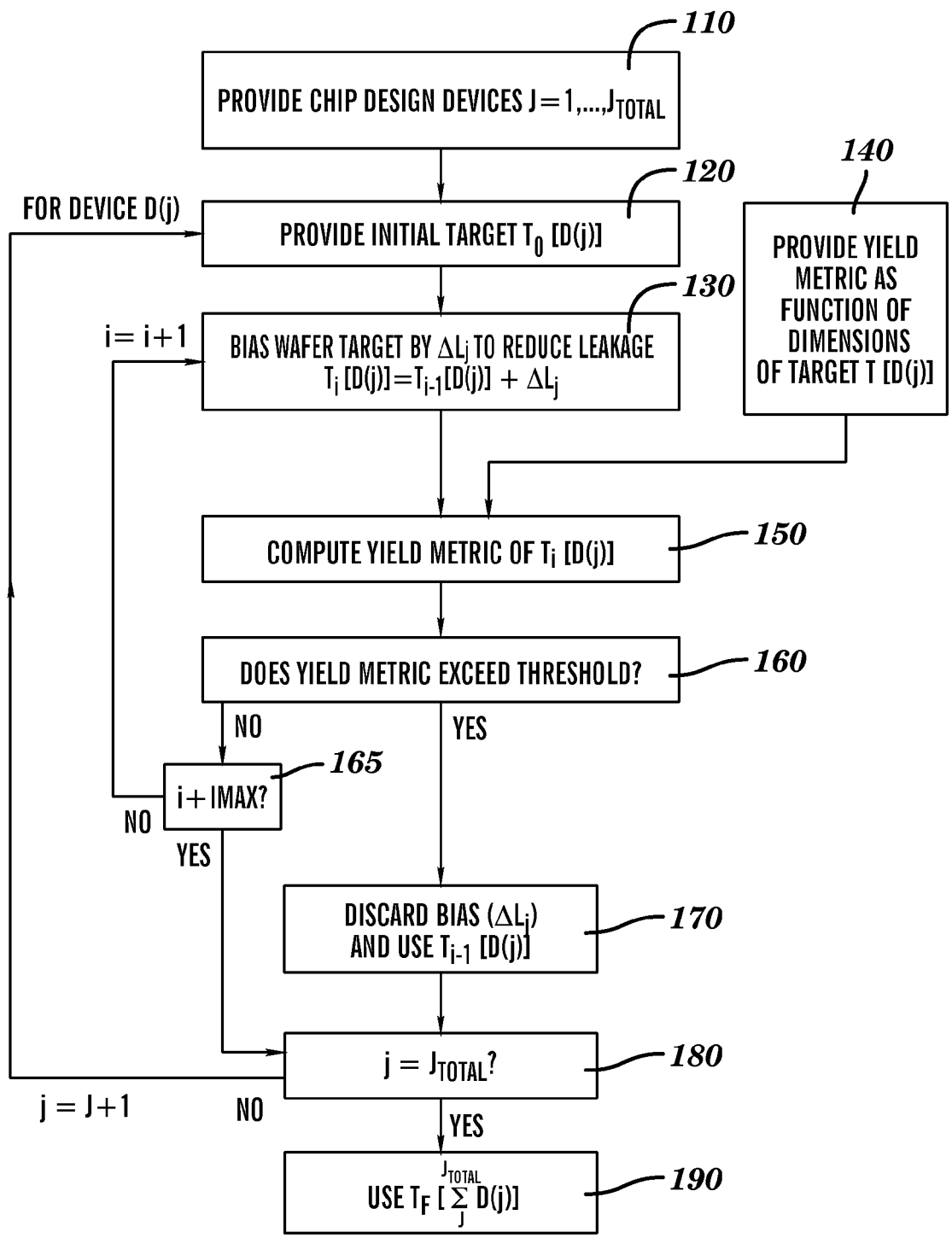
FIG. 1 illustrates a flow chart of an embodiment of a method for designing an on-wafer target for use in an OPC or OPC verification tool in accordance with the invention.

One embodiment of a method for designing an optimized target for use in a lithographic process tool, in accordance with the invention, is illustrated in FIG. 1. First, a chip layout of interest is provided (Block 110). The chip layout typically contains multiple layers of shapes, typically polygons, that, when printed, together form a predetermined number of $J_{Total}$ devices the comprise the chip. Each device layer contains polygon shapes to be printed according to an image transfer process, generally referred to herein as a lithographic process.

Figure 2:
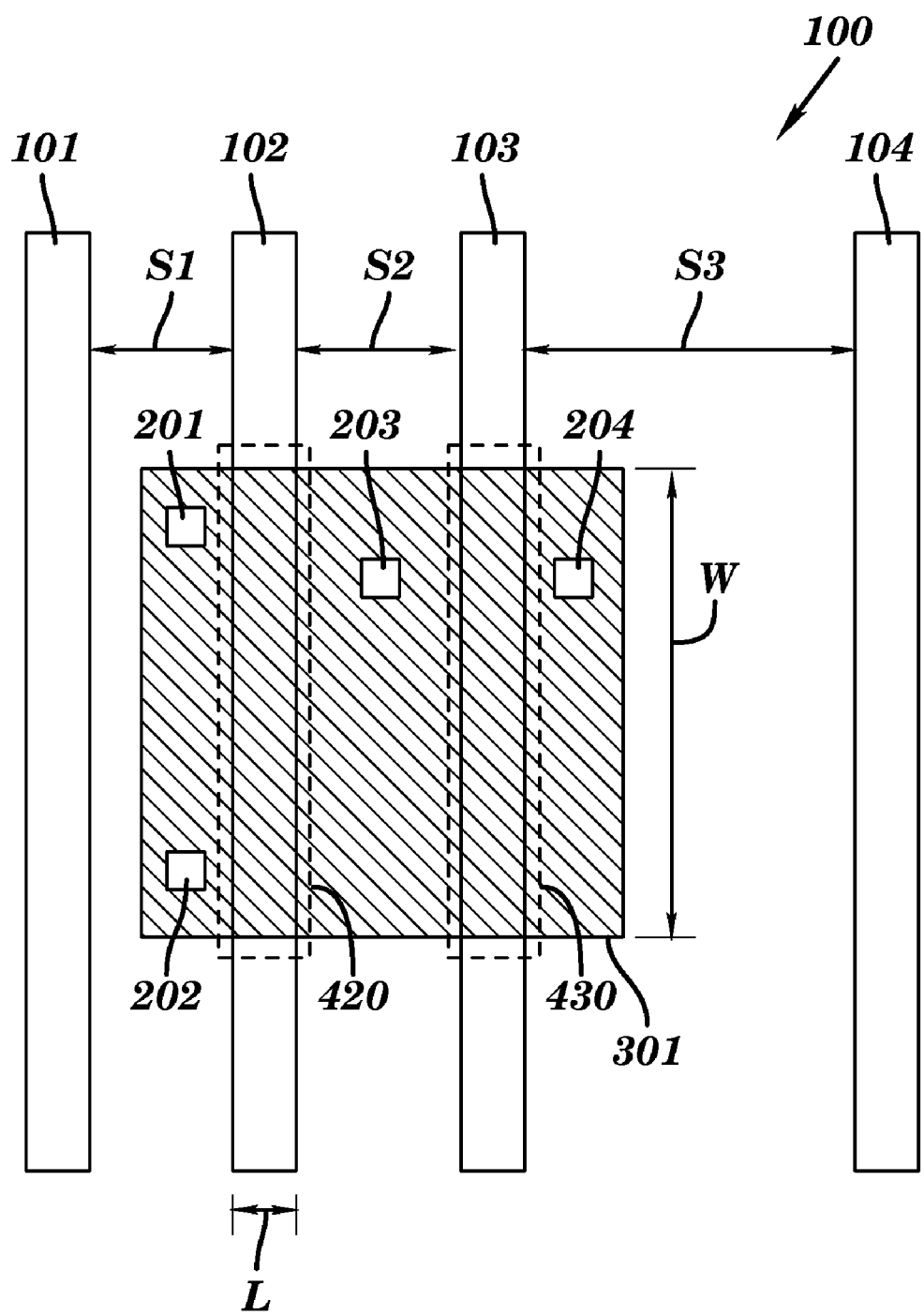
FIG. 2 illustrates a chip layout including three layers of device shapes.

For example, referring to FIG. 2, the chip design 100 may contain a first layer having a shape 301 that represents a device active region to be formed in a substrate. A second layer includes shapes for gate conductor (e.g. polysilicon) lines 101, 102, 103, 104. The gate conductors 102, 103, when printed on the wafer, will form transistor devices 420, 430, respectively, where the gate conductors 102, 103 overlay the active region 301 along the length W. A typical value for W is about 600 nm. The width $L_j$ of a jth polysilicon line is a critical dimension that determines the channel length of the device. A typical value for L is about 40 nm. The chip design 100 also includes a third layer containing a layout of contacts 201, 202, 203 and 204 for providing interconnection to other layers.

Next, referring again to FIG. 1, for each jth device D(j) in the layer of interest, an initial on-wafer target $T_0[D(j)]$ is provided that represents the desired image of the chip layout to be printed or transferred to the wafer (Block 120).

In a preferred embodiment, the on-wafer target is optimized to minimize a computed value of leakage current in each device, subject to one or more yield metrics. Leakage current, or drain current, $I_d$ can be represented as:

$$I_d \propto [\mu C_{gd} W/L] e^{(V_{gs}-V_{Th})} \qquad \text{Eq. 2}$$

where L is the channel length (or width of the gate conductor line), $\mu$ is mobility of the channel, $C_{gd}$ is the capacitance of the gate dielectric, W is the length of the active region along the length of the gate conductor line (orthogonal to the channel length L), $V_{gs}$ is the gate to source potential, and $V_{Th}$ is the threshold voltage. As can be seen from Eq. 2, leakage current $I_d$ will decrease as the channel length L increases. Therefore, in a preferred embodiment, the target width T=L of the gate conductor of device D(j) is biased larger by a predetermined amount $\Delta L_j$ for device j during an iteration i (Block 130), i.e.

$$T_i[D(j)] = L_i[D(j)] = L_{i-1}[D(j)] + \Delta L_j \qquad \text{Eq. 3}$$

In a preferred embodiment, the predetermined bias amount $\Delta L_j$ is equal to two times the size of a grid element used in an OPC tool.

However, the channel length L, or width of the gate conductor, is also constrained by one or more yield metrics, which is provided as a function of the dimensions of the target T[D(j)] (Block 140).

For example, referring again to FIG. 2, the space S1 between lines 101 and 102, space S2 between lines 102 and 103, and space S3 between lines 102 and 103 must be sufficiently large to minimize the risk that a defect would cause a short between neighboring lines. Such a yield metric $A_1$ relative to a first device 420 associated with line 102 may be expressed, for example, as:

$$A_1 = A_0 - (S1 * S2)^{0.5} \qquad \text{Eq. 4}$$

where $A_0$ is a predetermined constant.

Similarly, a second yield metric A2 may be provided for the second device 430 associated with line 103:

$$A_2 = A_0 - (S2 * S3)^{0.5} \qquad \text{Eq. 5}$$

Figure 3:
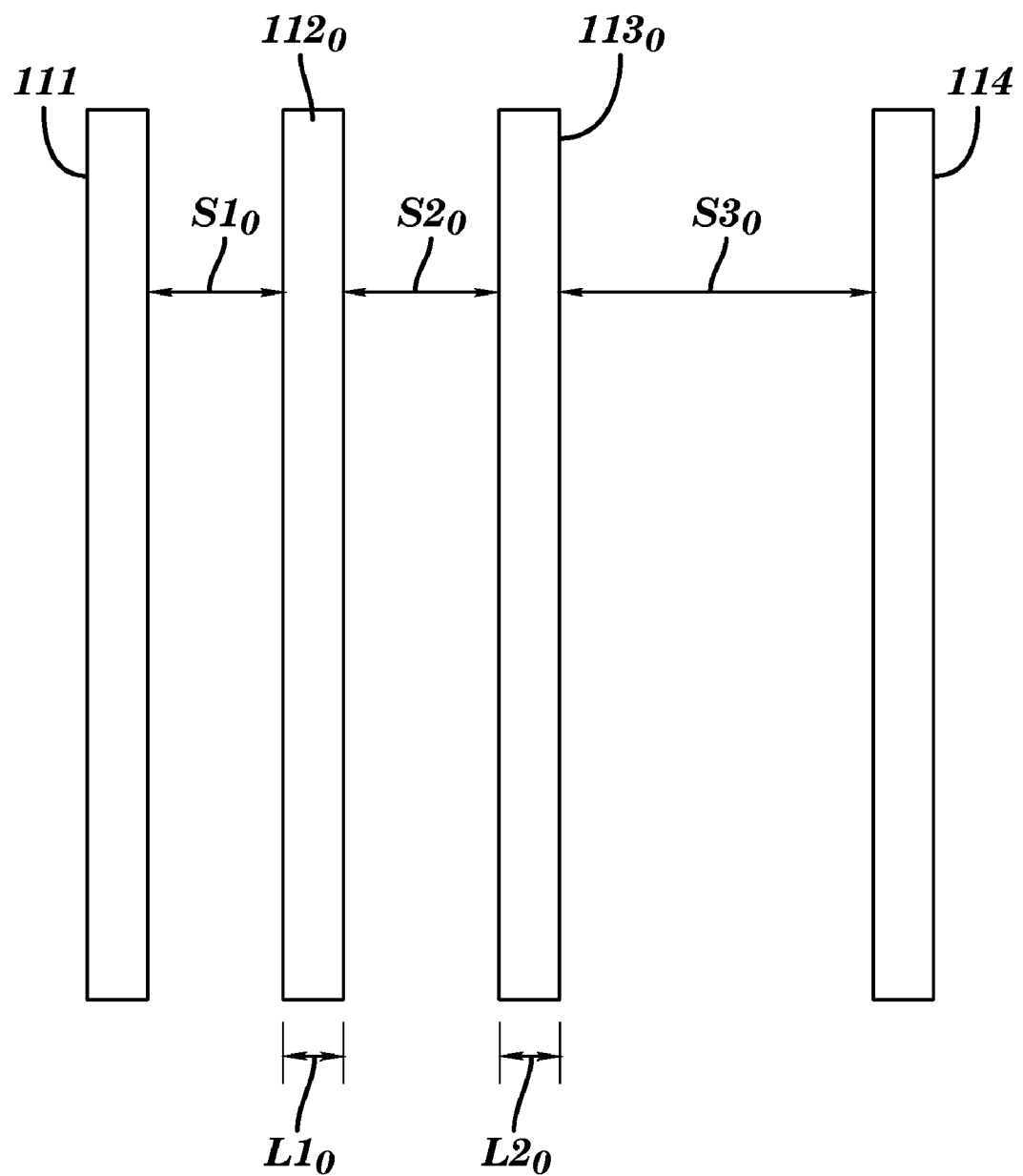
FIG. 3 illustrates an initial target corresponding to one layer of shapes to be printed.
Figure 4:
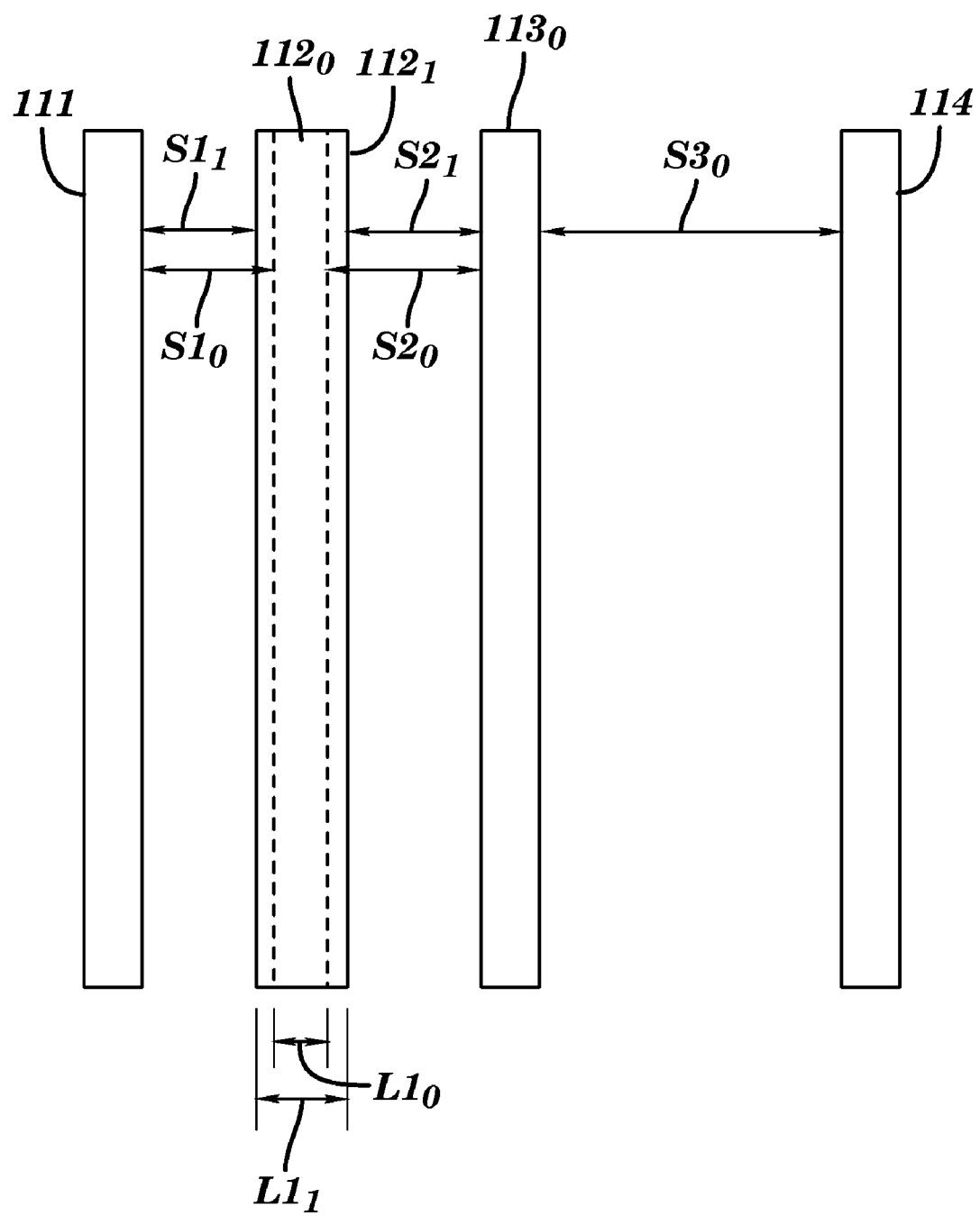
FIG. 4 illustrates a modified target shape after a first iteration in accordance with the invention.

For example, referring to FIG. 3, consider an initial target $112_0$ associated with the line 102 illustrated in FIG. 2. The initial target $112_0$ has an initial line width $L1_0$. Referring to FIG. 4, after a first iteration i=1, the target $112_0$ is biased by an amount $\Delta L_j$, so the biased target $112_1$ has a width $L1_1 = L1_0 + \Delta L_j$, so that $I_d$ for device 120 (see FIG. 2) has decreased in accordance with Eq. 2. Similarly, the space S1 between target 111 and target $112_1$ has changed to $S1_1 = S1_0 - \Delta L_j/2$ and the space S2 between target $112_1$ and $113_0$ has changed to $S2_1 = S2_0 - \Delta L_j/2$. The yield metric $A_1{}^i$ is computed for iteration i=1 in accordance with Eq. 4, i.e.

$$A_1{}^1 = A_0 - (S1_1 * S2_1)^{0.5} \qquad \text{Eq. 6}$$

Figure 5:
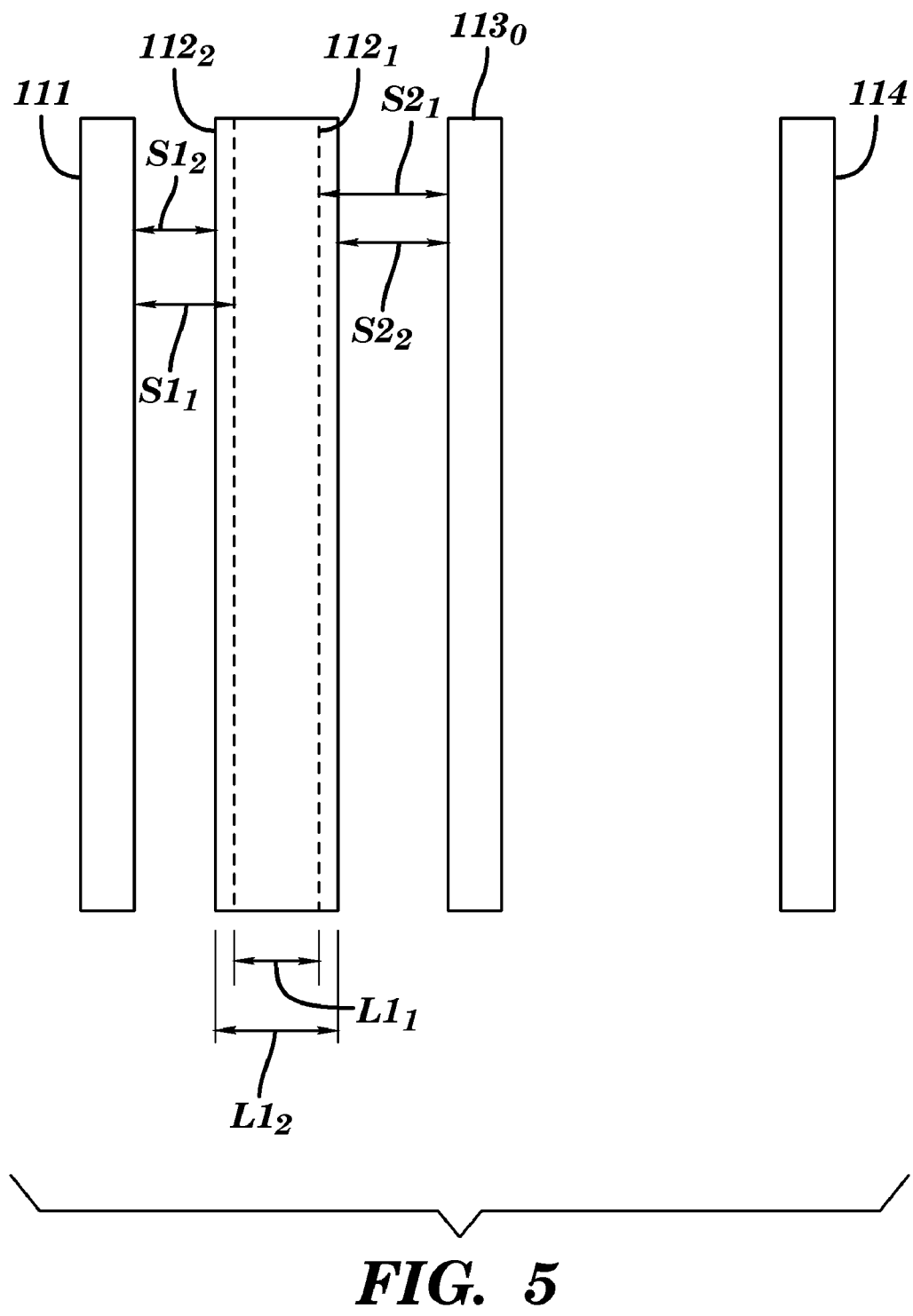
FIG. 5 illustrates a modified target shape after a second iteration in accordance with the invention.

If the yield metric $A_1{}^1$ does not exceed a predetermined threshold $A_1{}^{Max}$, then the method continues to the next iteration i=2, and the target width is biased by another increment $\Delta L_j$ resulting in the target $112_2$ as illustrated in FIG. 5. Similarly, the spaces $S1_2$ and $S2_2$ have each decreased accordingly by an amount $\Delta L_j/2$. The yield metric $A_1{}^2$ is computed (Block 150) using the dimensions for iteration 2. In this example, if the yield metric $A_1{}^2$ exceeds a predetermined threshold $A_2{}^{Max}$, then the width of target 112 is reverted to $L1_1$ which will be the final target $T_F$ for the line 102 of device 120.

In another example, a yield metric may be based on an electrical characteristic of the device, such as delay, which may be a function of a change in gate length L, e.g.

$$B_j = B_0 + \Delta L_j \cdot S_j \qquad \text{Eq. 7}$$

where $B_0$ is a predetermined constant, and $S_j$ is an empirically determined sensitivity of delay in device j to a change $\Delta L_j$ in gate length $L_j$.

Next, referring again to FIG. 1, the yield metric is computed based on the dimensions of the modified target $T_i[D(j)]$ (Block 150). A check is performed to determine whether the yield metric based on the dimensions of the modified target have exceeded a predetermined threshold or otherwise violates a predetermined yield metric constraint (Block 160). If the yield metric has exceeded the threshold, then the biased target for the current iteration i is discarded, and the target from the previous iteration $T_{i-1}[D(j)]$ is used (Block 170). If the yield metric constraint has not been violated, then Blocks 130, 150, 160 are repeated in a next i+1 iteration.

The method may also be limited to a predetermined maximum number of iterations $I_{max}$. The maximum number of iterations $I_{max}$ may be set based on a predetermined electrical criterion, for example, when the electrical metric changes by a relatively small amount for a corresponding change in the target dimension. For example, the leakage current $I_d$ may be simulated for each device as a function of changes in channel length L. Typically, $I_d$ decreases exponentially as the channel length L increases. If the incremental change in channel length results in, for example, less than a 10% change in $I_d$ relative to the nominal $I_d$ at the original channel length $L_0$, the maximum number of iterative increases in channel length $I_{max}$ can be set accordingly. If the number of iterations i is equal to the maximum $I_{max}$, then the iterations for device j is ended, and the last target $T_i$ is used as the final Target $T_F[D(j)]$ for device j (Block 190) and the next device j+1 is processed until all the devices $J_{Total}$ have been processed (Block 180). When all devices $J_{Total}$ have been processed, the method ends, and the final target $T_F[\Sigma_j{}^{jTotal}D(j)]$ is then provided to a tool, such as an OPC or OPC verification tool (Block 190). The tool will then compare the simulated image to the on-wafer target which has now been optimized to minimize leakage current, subject to yield metrics.

Figure 6:
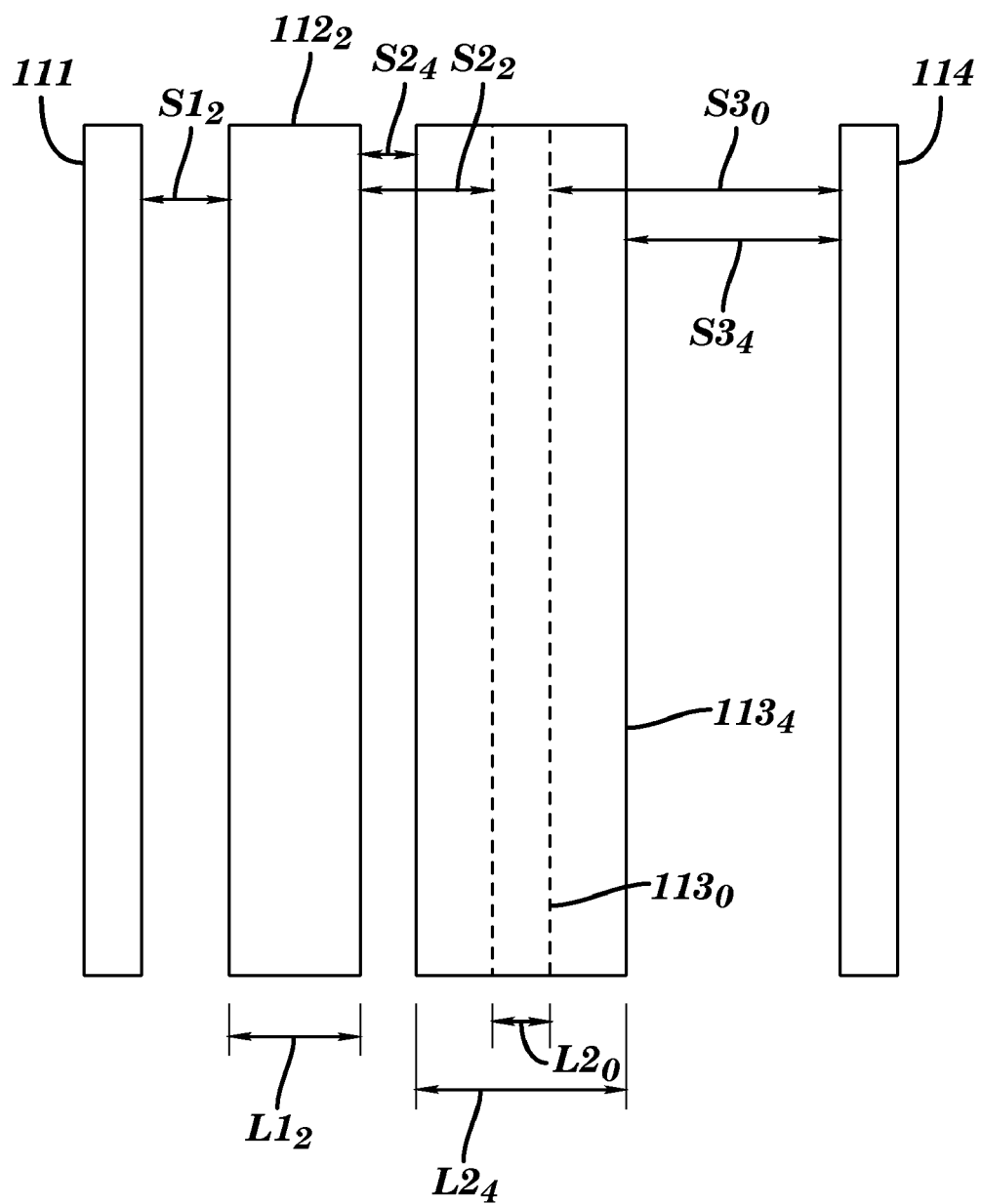
FIG. 6 illustrates a second target shape modified in accordance with the invention.

Referring to FIG. 6, illustrates target shape $113_0$ after several iterations of the method illustrated in FIG. 1. Target $113_0$ has an initial width $L2_0$. After several iterations, the modified width $L2_4$ is equal to $L2_0 + n\Delta L_j$. In this example, the method results in targets for similar devices that have different target dimensions based on the local environment.

Figure 7:
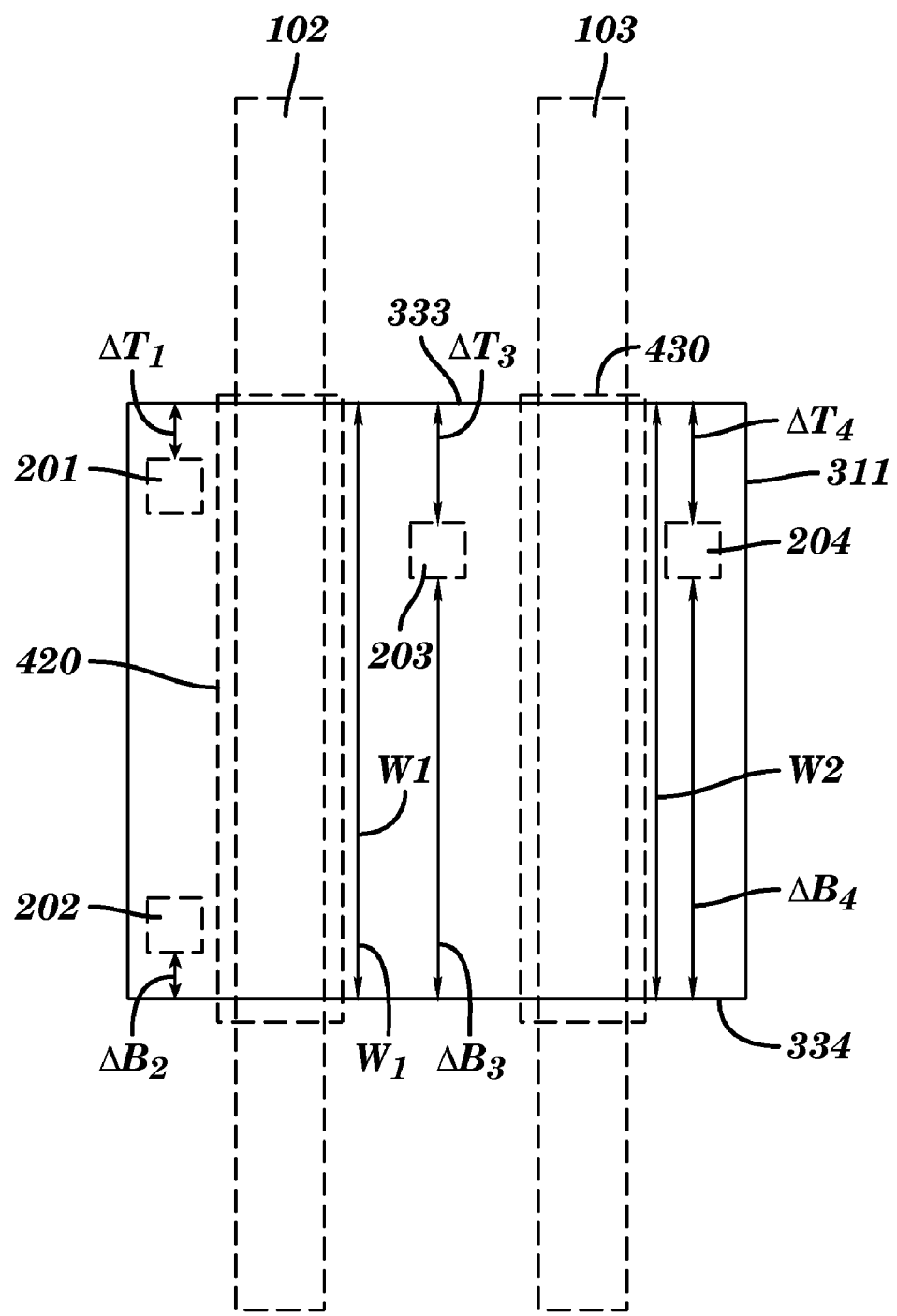
FIG. 7 illustrates an initial target shape for a second layer of shapes to be printed, and constraints on modifications in accordance with the invention.

In another embodiment, FIG. 7 illustrates an on-wafer target 311 for the active region 301 of the chip design 100 in FIG. 2. Also illustrated are the overlain shapes of the gate conductor lines 102, 103 and contacts 201, 202, 203 and 204. As indicated in Eq. 2, the leakage current $I_d$ is a function of the length where the conductor lines (e.g. 102, 103) overlays the active region 301. Thus, leakage current may be optimized by modifying the length W of the active region 301. An initial target 311 for the active region 301 has a top edge 333 and a bottom edge 334, which may be adjusted to modify, i.e. decrease, the length W, in accordance with the invention, for each of the devices 420, 430 (see FIG. 2) in order to minimize leakage current $I_d$ in accordance with Eq. 2. The modifications to W are subject to a yield metric that ensures sufficient landing space for the contacts on the active region. For example, a yield metric $Y_1$ for device 420 may be expressed as:

$$Y_1 = \frac{1}{\Delta T_1} + \frac{1}{\Delta B_2} + \frac{1}{\Delta T_3} + \frac{1}{\Delta B_3} \qquad \text{Eq. 8}$$

where $\Delta T_1$ is the distance from the top edge 333 of the target 311 to the nearest contact 201 on the left side of device 420, $\Delta B_2$ is the distance from the bottom edge 334 of the target 311 to the nearest contact 202 on the left side of device 420, $\Delta T_3$ is the distance from the top edge 333 of target 311 to the nearest contact 203 on the right side of device 420, and $\Delta B_3$ is the distance from the bottom edge 334 of the target 311 to the nearest contact 203 on the right side of device 420. The device 420 yield metric $Y_1$ must not exceed a predetermined constraint $Y_1^{Max}$.

Similarly, a second yield metric $Y_2$ for device 430 may be expressed as:

$$Y_2 = \frac{1}{\Delta T_3} + \frac{1}{\Delta B_3} + \frac{1}{\Delta T_4} + \frac{1}{\Delta B_4} \qquad \text{Eq. 9}$$

where $\Delta T_3$ is the distance from the top edge 333 of the target 311 to the nearest contact 203 on the left side of device 430, $\Delta B_3$ is the distance from the bottom edge 334 of the target 311 to the nearest contact 203 on the left side of device 430, $\Delta T_4$ is the distance from the top edge 333 of target 311 to the nearest contact 204 on the right side of device 430, and $\Delta B_4$ is the distance from the bottom edge 334 of the target 311 to the nearest contact 204 on the right side of device 430. The device 430 yield metric $Y_2$ must not exceed a predetermined constraint $Y_2^{Max}$.

Figure 8:
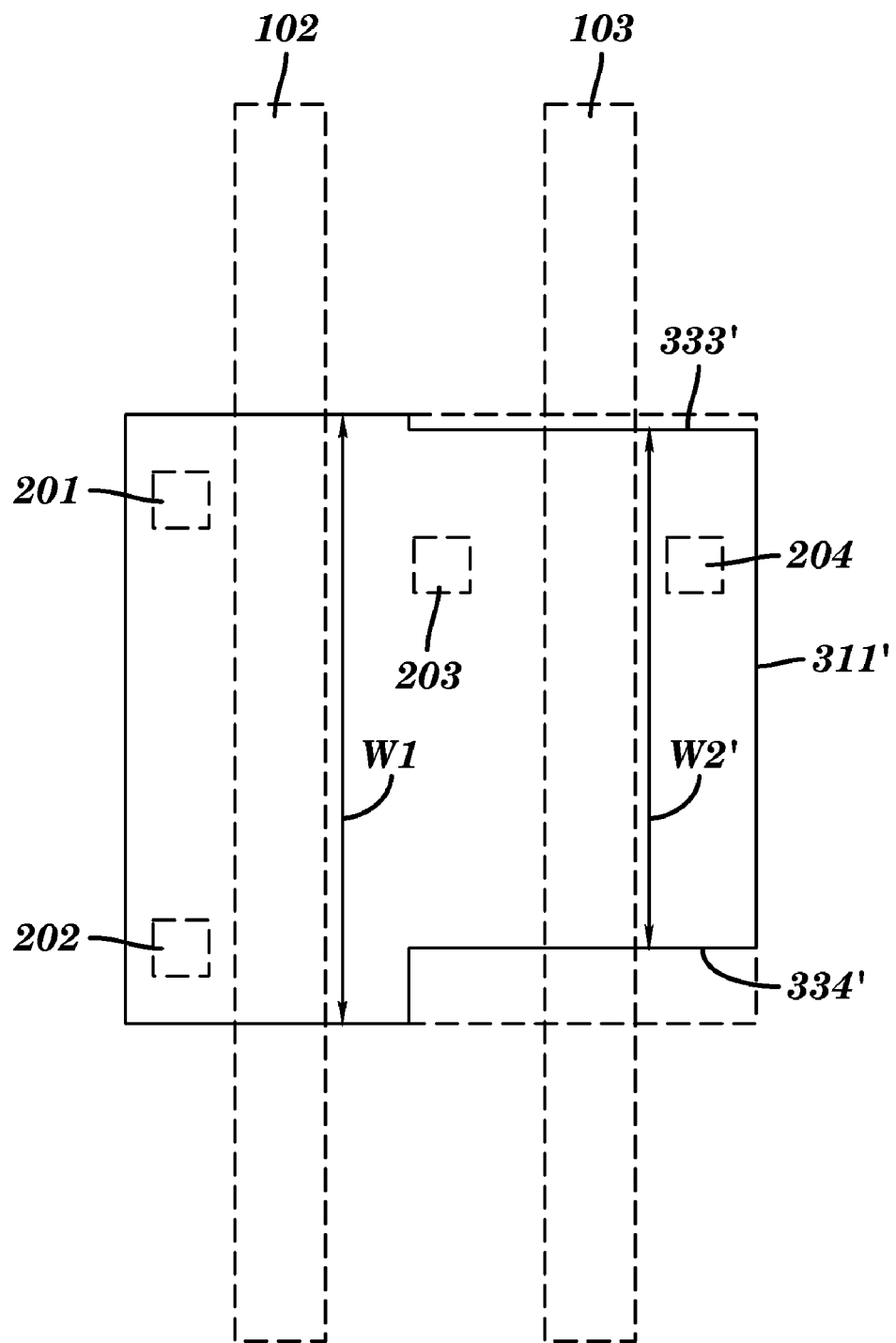
FIG. 8 illustrates a modification of the initial target shape of FIG. 7, modified in accordance with the invention.

FIG. 8 illustrates a modified target 311' for the active region 301 after performing modifications of the upper and lower edge positions 333, 334, respectively, subject to the yield constraints $Y_1^{Max} \geq Y_1$ and $Y_2^{Max} \geq Y_2$. In this example, the edges 333', 334' of the modified target 311' have been moved inward to decrease the length W2 of device 430 to the length W2', but the length W1 associated with device 420 has not been modified due to the constraint $Y_1^{Max}$. Targets for both the active region and the gate conductors modified in accordance with the invention may be used.

The method is not limited to the embodiment illustrated in FIG. 1. For example, the dimensions of every device $J_{Total}$ in the chip may be incrementally modified within each iteration, rather than completing the modifications for an individual device before modifying the next device. Additionally, the dimensions need not be modified symmetrically, but may be modified asymmetrically, for example, one side of a line may be increased by a greater amount than the other side.

In another embodiment, the order of device modifications may be sorted based on the electrical characteristic to be optimized or on the yield metric values. For example, referring to the yield metric $B_j$ of Eq. 7, which is based on the sensitivity $S_j$ of the delay as a function of change in gate length $\Delta L_j$, the $J_{Total}$ devices are sorted in increasing values of $S_j$. Thus, changes are made first to devices that have the smallest sensitivity to changes in the target gate lengths. Thus, it may be possible that the targets for devices having the highest sensitivity to changes in gate length may not be modified if a neighboring device with lower sensitivity has been modified, since the local environment may have been changed. However, the overall electrical characterization of the chip will have been improved even though not all of the device targets have been modified.

Figure 9:
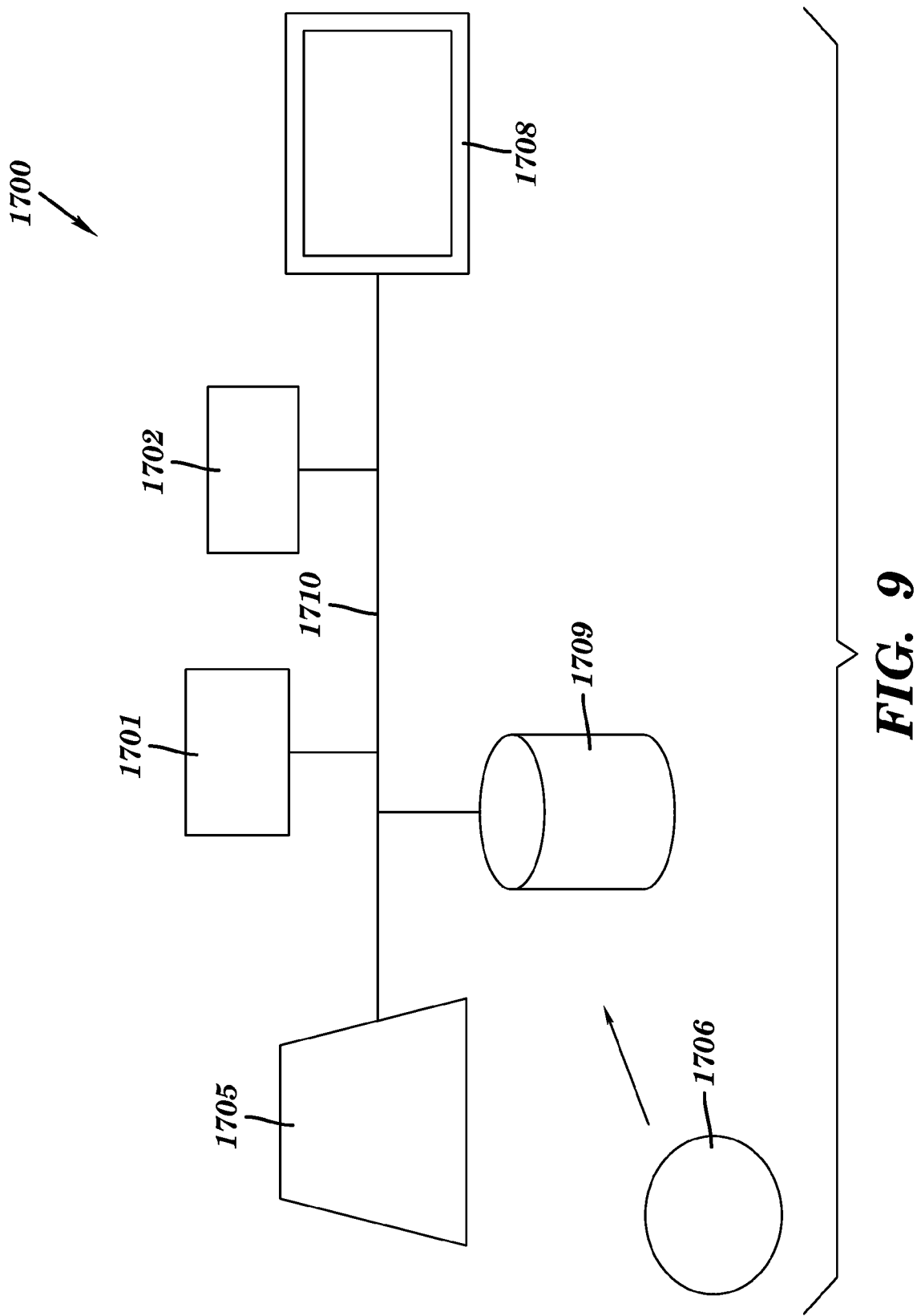
FIG. 9 illustrates an embodiment of a method for designing an on-wafer target implemented in a computer program product and computer system for executing method steps in accordance with the invention.

In one embodiment of the present invention, referring to FIG. 9, instructions for causing a computer or computer system to perform the method steps may be incorporated into a design tool implemented in a digital computer 1700, having components including, but not limited to: a central processing unit (CPU) 1701, at least one input/output (I/O) device 1705 (such as a keyboard, a mouse, a compact disk (CD) drive, and the like), a display device 1708, a storage device 1709 capable of reading and/or writing computer readable code, and a memory 1702, all of which are connected, e.g., by a bus or a communications network 1710. The present invention may be implemented as a computer program product containing instructions stored on a computer readable medium, such as a tape or CD 1706, which may be, for example, read by the I/O device 1705, and stored in the storage device 1709 and/or the memory 1702. The computer program product contains instructions to cause a computer system to implement a method for designing an on-wafer target in accordance with the present invention. The invention can take the form of an entirely hardware embodiment, and entirely software embodiment or an embodiment containing both hardware and software elements. In a preferred embodiment, the invention is implemented in a computer program product that contains instructions for executing method steps for designing the on-wafer target, executable by a computer, which includes, but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus, device or element that can contain or store the program for use by or in connection with the computer or instruction execution system. The medium can be an electronic, magnetic, optical, electromagnetic, infrared, or semiconductor storage medium. Examples of a storage medium include a semiconductor memory, fixed storage disk, moveable floppy disk, magnetic tape, and an optical disk. Current examples of optical disks include compact disk-read only memory (CD-ROM), compact disk-read/write (CD-R/W) and digital video disk (DVD).

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed:

1. A method of designing a lithographic mask comprising the steps of:
   providing an integrated circuit design comprising a device layer of shapes to be printed and an initial on-wafer target layout corresponding to said device layer;
   providing an electrical metric for said integrated circuit design, said electrical metric having a functional relationship to a first dimension that is represented in said initial on-wafer target layout;
   providing a yield metric having a functional relationship to said first dimension that is represented in said initial on-wafer target layout; and
   improving said electrical metric, within a predetermined electrical criterion, in said initial on-wafer target layout by using a computer in modifying said first dimension to form a modified target layout such that a computed yield metric based on said modified target layout satisfies a predetermined yield constraint,
   wherein order of device modification is sorted based on electrical characteristic to be improved or based on value of said yield metric.

2. The method of claim 1, wherein said electrical metric is a computed value of leakage current.

3. The method of claim 1, wherein said yield metric comprises a function of spacing between a first conductive feature and a nearest neighbor conductive feature.

4. The method of claim 1, wherein said step of improving said electrical metric comprises:
- modifying said first dimension by a predetermined increment to form said modified target layout;
- computing said yield metric based on said modified target layout;
- comparing said computed yield metric with said predetermined yield constraint; and
- repeating said steps of modifying said first dimension, computing said yield metric based on said modified target layout and comparing said computed yield metric, as long as said computed yield metric satisfies said predetermined yield constraint.

5. The method of claim 4, wherein said predetermined increment is based on a size of a grid element used in an Optical Proximity Correction (OPC) tool.

6. The method of claim 4, wherein said repeating said steps of modifying said first dimension, computing said yield metric and comparing said computed yield metric continues for up to a predetermined maximum number of iterations.

7. The method of claim 1, wherein said modifying said first dimension is performed asymmetrically.

8. The method of claim 1, wherein said step of improving said electrical metric is performed for devices in said integrated circuit design sorted according to said electrical metric or said yield metric.

9. The method of claim 1, wherein said yield metric is based on a sensitivity of a device electrical characteristic as a function of change in said first dimension.

10. A computer program product comprising a non-transitory computer storage medium including computer readable instructions wherein the computer readable instructions when executed on a computer system causes the computer system to perform the method steps of:
- providing an integrated circuit design comprising a device layer of shapes to be printed and an initial on-wafer target layout corresponding to said device layer;
- providing an electrical metric for said integrated circuit design, said electrical metric having a functional relationship to a first dimension of said chip layout that is represented in said initial on-wafer target layout;
- providing a yield metric having a functional relationship to said first dimension of said chip layout that is represented in said initial on-wafer target layout; and
- improving said electrical metric, within a predetermined electrical criterion, in said initial on-wafer target layout by modifying said first dimension to form a modified target layout such that a computed yield metric based on said modified target layout satisfies a predetermined yield constraint,
- wherein order of device modification is sorted based on electrical characteristic to be improved or based on value of said yield metric.

11. The computer program product of claim 10, wherein said electrical metric is a computed value of leakage current.

12. The computer program product of claim 11, wherein said first dimension comprises a width of a gate conductor line and said yield metric comprises a function of spacing between said gate conductor line and a nearest neighbor conductive feature.

13. The computer program product of claim 10, wherein said step of improving said electrical metric comprises:
- modifying said first dimension by a predetermined increment to form said modified target layout;
- computing said yield metric based on said modified target layout;
- comparing said computed yield metric with said predetermined yield constraint; and
- repeating said steps of modifying said first dimension, computing said yield metric based on said modified target layout and comparing said computed yield metric, as long as said computed yield metric satisfies said predetermined yield constraint.

14. The computer program product of claim 13, wherein said predetermined increment is two times a size of a grid element used in an OPC tool.

15. The computer program product of claim 13, wherein said repeating said steps of modifying said first dimension, computing said yield metric and comparing said computed yield metric continues for up to a predetermined maximum number of iterations.

16. The computer program product of claim 10, wherein said modifying said first dimension is performed asymmetrically.

17. The computer program product of claim 10, wherein said step of improving said electrical metric is performed for devices in said integrated circuit design sorted according to said electrical metric or said yield metric.

18. The computer program product of claim 10, wherein said yield metric is based on a sensitivity of a device electrical characteristic as a function of change in said first dimension.

* * * * *